(12) United States Patent
Bondar

(10) Patent No.: US 9,093,237 B2
(45) Date of Patent: Jul. 28, 2015

(54) CONTROL DEVICE FOR AN ELECTRICAL APPLIANCE

(71) Applicant: Micronas GmbH, Freiburg (DE)

(72) Inventor: Yan Bondar, Waldkirch (DE)

(73) Assignee: Micronas GmbH, Freiburg (DE)

( * ) Notice: Subject to any disclaimer, the term of this patent is extended or adjusted under 35 U.S.C. 154(b) by 199 days.

(21) Appl. No.: 13/758,466

(22) Filed: Feb. 4, 2013

(65) Prior Publication Data

US 2013/0200965 A1 Aug. 8, 2013

(30) Foreign Application Priority Data

Feb. 3, 2012 (DE) .......................... 10 2012 001 997

(51) Int. Cl.
| | |
|---|---|
| H01H 25/00 | (2006.01) |
| H01H 25/04 | (2006.01) |
| F24C 7/08 | (2006.01) |
| H01F 7/02 | (2006.01) |

(52) U.S. Cl.
CPC ............... *H01H 25/008* (2013.01); *F24C 7/08* (2013.01); *F24C 7/083* (2013.01); *H01F 7/02* (2013.01); *H01F 7/0247* (2013.01); *H01H 25/04* (2013.01)

(58) Field of Classification Search
CPC ... H01H 25/008; H01H 25/04; H01H 25/041; H01H 2025/043; H01H 2025/045; H01H 2025/046; H01H 2025/048
USPC .................................................. 335/205–207
See application file for complete search history.

(56) References Cited

U.S. PATENT DOCUMENTS

| 4,868,530 | A | * | 9/1989 | Ahs ................................. 335/207 |
|---|---|---|---|---|
| 5,504,502 | A | * | 4/1996 | Arita et al. ..................... 345/160 |
| 5,920,131 | A | | 7/1999 | Platt et al. |
| 6,812,435 | B2 | | 11/2004 | Schilling |
| 7,504,598 | B2 | * | 3/2009 | Weigold ................. 200/61.45 R |
| 7,642,886 | B2 | | 1/2010 | Boss |
| 7,994,886 | B2 | * | 8/2011 | Bedell ............................ 335/205 |
| 8,344,834 | B2 | * | 1/2013 | Niiyama ........................ 335/207 |
| 2002/0054012 | A1 | * | 5/2002 | Endo et al. ..................... 345/156 |
| 2004/0233159 | A1 | * | 11/2004 | Badarneh ....................... 345/156 |

(Continued)

FOREIGN PATENT DOCUMENTS

| DE | 199 06 365 A1 | 8/2000 |
|---|---|---|
| DE | 101 57 565 A1 | 6/2003 |

(Continued)

OTHER PUBLICATIONS

Google translation for DE10 2006 034391 A1.*

*Primary Examiner* — Mohamad Musleh
(74) *Attorney, Agent, or Firm* — Muncy, Geissler, Olds & Lowe, P.C.

(57) ABSTRACT

A control device is provided that includes a plate and a control unit. The control unit has a rotary unit designed as a transmitter unit and a receiver unit. The transmitter unit has a top surface and a bottom side, wherein a base is formed on the bottom side in a center region and a first magnetizable element or a first magnet for positioning the transmitter unit at a predefined position over the receiver unit is arranged in the center region. In a rest position the transmitter unit rests with the base on the plate and the axis of rotation extends essentially parallel to the normal of the plate, or the transmitter unit is tilted into an operating position such that the base rests only partially on the plate and the axis of rotation is tilted relative to the normal of the plate.

23 Claims, 3 Drawing Sheets

(56) References Cited

U.S. PATENT DOCUMENTS

2004/0252104 A1* 12/2004 Nakamura et al. ............ 345/160
2005/0068135 A1* 3/2005 Nishino et al. ................ 335/207
2006/0278011 A1* 12/2006 Miyasaka et al. ............... 73/753

FOREIGN PATENT DOCUMENTS

| DE | 102 12 929 A1 | 10/2003 |
| DE | 20 2004 017 133 U1 | 3/2005 |
| DE | 10 2006 034 391 A1 | 1/2008 |
| DE | 10 2006 045 735 A1 | 3/2008 |
| DE | 10 2007 056 416 A1 | 5/2009 |
| DE | 10 2008 013 003 A1 | 9/2009 |
| DE | 10 2009 000 388 A1 | 7/2010 |
| EP | 0 797 227 A2 | 9/1997 |
| WO | WO 9320535 A2 * | 10/1993 |
| WO | WO 2011155393 A1 * | 12/2011 |

* cited by examiner

CONTROL DEVICE FOR AN ELECTRICAL APPLIANCE

This nonprovisional application claims priority under 35 U.S.C. §119(a) to German Patent Application No. DE 10 2012 001 997.1, which was filed in Germany on Feb. 3, 2012, and which is herein incorporated by reference.

BACKGROUND OF THE INVENTION

1. Field of the Invention

The invention relates to a control device for an electrical appliance.

2. Description of the Background Art

Known from EP 0 797 227 A2, which corresponds to U.S. Pat. No. 5,920,131, is a control device for controlling an electrical appliance. The control device has a handle as a transmitter unit with a ferromagnetic disk that rests upon a plate of the electrical appliance. An annular magnet is located beneath the plate. By means of the magnet, a force is exerted on the ferromagnetic disk and holds the handle in its axial and radial position in such a way that the handle is rotatable as well as being easily removable from the plate of the electrical appliance without tools.

Known from DE 102 12 929 A1, which corresponds to U.S. Pat. No. 6,812,435, is a control device of the generic type for a cooktop. In this design a restoring force is exerted on the transmitter unit of the control device by means of magnetic force from the bottom side of the cooktop, and the control device is positioned. The transmitter unit has a base in a center region. A receiver unit with sensors is located on the bottom side of the cooktop to detect the rotary and tilting motions of the transmitter unit. In addition, from DE 20 2004 017 133 U1 a transmitter unit of the generic type is known that controls the individual burner plates of the cooktop by rotating and displacing the transmitter unit on the surface of the cooktop, which is implemented as glass ceramic, for example, via a receiver unit that is located under the cooktop and has a sensor.

Moreover, another control device of the generic type with a transmitter unit and a receiver unit is known from DE 10 2006 034 391 A1. The cylindrical transmitter unit comprises a magnetizable element in a center region and multiple individual magnets arranged in an edge region. In addition, the transmitter unit has a contact surface in a center region with which the transmitter unit rests on the cooktop in a rest position. A convex region adjoins the edge of the transmitter unit on the contact surface. As a function of the direction of tilt, different parts of the convex region of the transmitter unit rest on the cooktop over the receiver unit. In addition to a magnet that is centrally located under the transmitter unit and that serves to position the transmitter unit, the receiver unit also includes multiple sensors located at angles of 60° around the central magnet. By means of the sensors, which are designed as Hall sensors, for example, a signal associated with the direction of tilt and the amount of tilt of the transmitter unit can be output, with which signal the cooktop can be controlled.

SUMMARY OF THE INVENTION

It is therefore an object of the invention to provide a control device that advances the conventional art.

According to an embodiment of the invention, a control device is provided that comprises a plate and a control unit, wherein the control unit has a rotary unit with an axis of rotation designed as the transmitter unit and has a receiver unit, and the transmitter unit is located above the plate and the receiver unit is located below the plate, and the transmitter unit has a top surface and a bottom side, wherein a base is formed on the bottom side in a center region and a first magnetizable element or a first magnet for positioning the transmitter unit at a predefined position over the receiver unit is arranged in the center region, wherein in a rest position the transmitter unit rests with the base on the plate and the axis of rotation extends essentially parallel to the normal of the plate, or the transmitter unit is tilted into an operating position such that the base rests only partially on the plate and the axis of rotation is tilted relative to the normal of the plate, wherein a restoring force for assuming the rest position acts on the transmitter unit by means of a second magnet or a second magnetizable element, and wherein the receiver unit has a center region and has a first type of sensors in an annular outer region spaced apart from the center region, and wherein the receiver unit has the second magnet or the second magnetizable element, wherein a first ring magnet is located in an outer region of the transmitter unit and the first ring magnet surrounds the center region of the transmitter unit and is spaced apart from the center region. It should be noted that the terms center region and outer region of the transmitter unit and receiver unit preferably are understood to mean a region of circular shape. It should also be noted that the term spaced apart preferably is understood to mean a uniform spacing between a relevant center region and the associated outer region. Moreover, the term inclination is understood to mean a tilting of the axis of rotation of the transmitter unit with regard to the direction of the axis of rotation of the transmitter unit in the rest position, wherein for the purpose of labeling the direction of inclination, especially in the case of a circular design of the outer region of the receiver unit, the outer circle or the segments of the circle, for example, can be labeled in accordance with the numerals of a clock. For example, an inclination of the axis of rotation in the direction of a circular segment could be labeled as inclination of the axis of rotation in the 3 o'clock direction. Moreover, an axial or vertical direction is understood to mean a direction that is parallel to the axis of rotation, at least in the rest position.

An advantage of the control device is that electrical loads can be selected and controlled in a simple and reliable way with the control device without a direct electrical connection between the transmitter unit and the receiver unit. Investigations have shown that with an arrangement of a first ring magnet in the outer region of the transmitter unit in conjunction with an outer region of the receiver unit, wherein sensors of a first type are arranged in the outer region of the receiver unit, the flux change caused by an inclination of the first ring magnet can be detected in a simple and reliable way with a small number of sensors. In addition to the direction of inclination, the amount of inclination can also be determined from the detection of the flux change. In particular, specific circular segments of the outer circle of the receiver unit can be associated with different electrical loads. When an inclination in the direction of the corresponding circular segment takes place, the associated load can be selected, which is to say switched on or off or activated for reception of further commands, for example. In particular, further control commands can be carried out by means of the amount of inclination, as for example the level of an output setting of the activated load. Because the transmitter unit is separated from the receiver unit by a plate, loads can even be operated in a potentially explosive environment. The prerequisite is that the magnetic flux from the transmitter unit passes through the plate and thus through the sensors on the receiver unit. In this way, nonmagnetic materials, for example glass, etc., can be used by preference as materials for the plate. Because the transmitter unit is not mechanically fastened to either the plate or the receiver unit, it can be removed from the plate without difficulty. Preferably, the transmitter unit has no power supply.

According to an embodiment, the outer region of the transmitter unit and the outer region of the receiver unit are implemented one vertically above the other in the rest position. In particular, it is advantageous for each of the two outer regions as a whole, which is to say the entire outer region of the transmitter unit and the entire outer region of the receiver unit, to have essentially the same diameter and an essentially uniform spacing from one another. Preferably, the diameters of the two outer regions are equal. Furthermore, the outer region of the transmitter unit is spaced apart from the plate in the vertical or axial direction.

In another enhancement, in the rest position the axis of rotation passes through the center region of the transmitter unit and through the center region of the receiver unit. It is advantageous for the transmitter unit and the receiver unit to be aligned with one another such that the axis of rotation passes through the center of both center regions.

In accordance with an embodiment, a plate-shaped first flux concentrator is located on the surface of the transmitter unit facing away from the plate. It is preferred for the first flux concentrator to cover the ring magnet and the center region. In another embodiment, a plate-shaped second flux concentrator is located on the surface of the receiver unit facing away from the plate. In this design, it is preferred for the second flux concentrator to cover at least the center region and the first type of magnetic field sensors. It is an advantage of the flux concentrators that the magnetic field lines are guided within the flux concentrators, thereby increasing the magnetic flux in the sensors of the receiver unit. Investigations have shown that the flux concentrator can be made of a magnetically soft metal, extremely preferably of a mu metal.

In an embodiment, the direction and amount of inclination of the transmitter unit or the inclination of the axis of rotation relative to the normal of the plate are sensed by means of the first type of sensors. Preferably, a magnetic flux change parallel to the normal is detected for this purpose by the first type of sensors. In an alternative embodiment, the first type of sensors is implemented such that the sensors also sense a rotation about the axis of rotation of the transmitter unit. Investigations have shown that it is advantageous to arrange the sensors of the first type on the outer region of the receiver unit such that exactly four sensors are arranged at an angle of essentially or exactly 90° to one another. Preferably, Hall sensors can be used as sensors of the first type. Investigations have shown that 1-dimensional Hall sensors are preferably used for sensing the inclination and direction of inclination. One-dimensional Hall sensors are understood to be planar Hall sensors that measure a magnetic field perpendicular to the sensor surface.

In accordance with an embodiment, a second type of sensor is provided in the receiver unit at the outer region or in the center region. In this design, the second type of sensor detects a magnetic flux change in a plane perpendicular to the normal of the plate. It is advantageous for a rotation of the transmitter unit about the axis of rotation to be sensed by means of the second type of sensor. It has been shown that it is sufficient to sense the rotation of the transmitter unit about the axis of rotation by means of a single sensor. In accordance with an alternative embodiment, the rotation of the transmitter unit about the axis of rotation can also be sensed by multiple sensors of the second type.

In an embodiment, all magnetic field sensors can be located below the plate, i.e. on or at the receiver unit. In this design, the first type is implemented as so-called 1-dimensional Hall sensors, and the second type is implemented as so-called 3-dimensional Hall sensors. In an alternative embodiment, 2-dimensional, so-called x-y, Hall sensors are used. Such x-y Hall sensors can also be referred to as vertical sensors, and detect two magnetic field components that are parallel to the sensor surface. Investigations have shown that it is especially advantageous to provide exactly 4 sensors of the first type and exactly one sensor of the second type in the receiver unit. In an enhancement of this design, the sensor of the second type is located at the outer edge of the receiver unit or in the center region of the receiver unit.

It has been shown that an implementation of the first type and/or second type of sensors as Hall sensors provides especially reliable results. In another embodiment, the first ring magnet has a diametrical or axial magnetization. In an alternative embodiment, the first magnet or the first magnetizable element and/or the second magnet or the second magnetizable element are magnetized axially, i.e., parallel to the direction of the axis of rotation.

In accordance with another enhancement, the second magnet or the second magnetizable element can be located in the center region of the receiver unit.

In an alternative embodiment, the second magnet or the second magnetizable element is located in the outer region of the receiver unit. The second magnet in the outer region of the receiver unit can be designed as a second ring magnet, wherein the second ring magnet surrounds the center region of the transmitter unit at a distance. In this design, the spacing between the center region and the outer region is preferably uniform. It should be noted that both the first ring magnet and the second ring magnet have the geometric shape of a thick-walled hollow cylinder.

In an embodiment of the transmitter unit and receiver unit, an axially magnetized first magnet is placed in the center of the transmitter unit and a diametrically magnetized first ring magnet is placed in the outer region of the transmitter unit. A second axially magnetized magnet is placed in the center region of the receiver unit, wherein the poles of the first magnet and second magnet attract one another. In this design, at least four sensors of the first type in the form of 1-D Hall sensors are arranged in the outer region of the receiver unit at an angular spacing of 90° to one another. Moreover, one sensor of the second type in the form of a 3-D Hall sensor is located in the outer region. In the rest position, the axis of rotation of the transmitter unit passes through the center of the first magnet and the center of the second magnet.

In another embodiment of the transmitter unit and receiver unit, a diametrically magnetized first magnet is placed in the center of the transmitter unit and an axially magnetized first ring magnet is placed in the outer region of the transmitter unit. An axially magnetized second ring magnet is placed in the outer region of the receiver unit, wherein the poles of the first ring magnet and second ring magnet attract one another. At least four sensors of the first type in the form of 1-D Hall sensors are arranged in the outer region of the receiver unit between the first ring magnet and second ring magnet at an angular spacing of 90° to one another. Moreover, in place of a second magnetic element or second magnet, a sensor of the second type in the form of a 3-D Hall sensor or an x-y Hall sensor is located in the center region of the receiver unit. In the rest position, the axis of rotation of the transmitter unit passes through the center of the first magnet and the center of the 3-D Hall sensor or the x-y Hall sensor.

It is advantageous for a printed circuit board to be provided below the plate and for the printed circuit board to be essentially uniformly spaced from the plate in the direction of extension of the printed circuit board, wherein the printed circuit board accommodates the sensors of the first type and the sensor or sensors of the second type, as well as the second magnet or second magnetizable element, on the side facing the plate.

It is advantageous for the spacing between the printed circuit board and the plate to be determined by the axial extent of the second magnet or second magnetizable element. Investigations have shown that the second flux concentrator is preferably placed on the side of the printed circuit board facing away from the plate, and in particular covers the outer region of the receiver unit. By means of the first flux concentrator and second flux concentrator, an especially high magnetic flux is achieved in the two types of sensors, and the sensitivity of the two types of sensors to a change in the magnetic flux is increased. In the Hall sensors, a large magnetic flux results in a large Hall voltage.

Preferably, the first magnet or first magnetizable element and/or the second magnet or second magnetizable element are designed to have a cylindrical shape.

Other investigations have determined that the control unit can be used for controlling a cooktop with at least one cooktop of an electric range. The plate can be made of glass ceramic.

Another application possibility resides in the use of the control unit as a control knob for controlling electrical appliances, especially measuring instruments. For example, an HMI interface can be activated, and an associated menu can be operated, by means of the transmitter unit. An HMI interface is understood to be a human-machine interface. By tilting the transmitter, one of several functions of the menu and/or one of several devices can be selected. By rotating the transmitter unit, the values for a device can be set within a menu, for example, and another tilting can confirm a selection of the values and/or terminate the menu. In this way, a keyboard for selecting and/or setting of values of an electrical device can be avoided.

In an embodiment, the receiver unit and the transmitter unit are individualized, in particular by means of an ID label. The ID labels of the transmitter unit and the receiver unit are matched to one another. It is advantageous here when the receiver unit can only be activated with a specific associated label of the transmitter unit. RFID transponder techniques can preferably be used for this purpose.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3b shows a view of the bottom side of the transmitter unit of the embodiment shown in FIG. 3a;

FIG. 3c shows a top view of the top side of the receiver unit of the embodiment shown in FIG. 3a.

DETAILED DESCRIPTION

Figure 1:
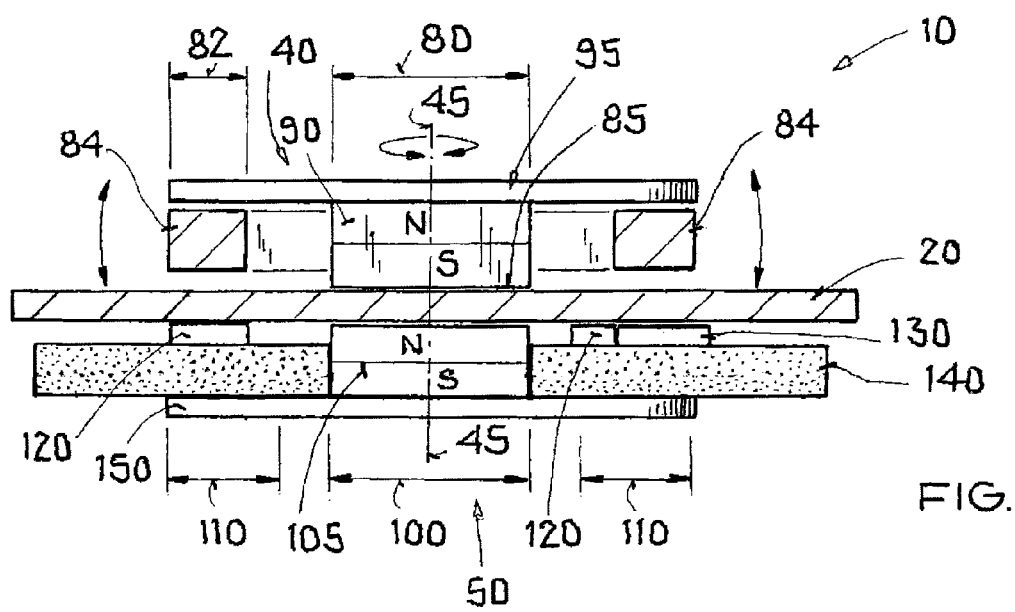
FIG. 1 shows a cross-sectional view of a first embodiment of the control device.

The diagram in FIG. 1 shows a control device 10 with a plate 20 and a control unit. The control unit comprises a rotary unit embodied as the transmitter unit 40 with an axis of rotation 45 and a receiver unit 50. The transmitter unit 40 is located above the plate 20 and the receiver unit 50 is located below the plate 20. Preferably, the transmitter unit 40 is designed to be circular. The receiver unit 50 is frictionally attached to the plate 20 by a fastening device. The transmitter unit 40 is rotatable about the axis of rotation 45. In a rest position, the axis of rotation 45 is oriented parallel to the normal of the plate 20, but the transmitter unit 40 can be rotated about the axis of rotation 45. In accordance with an alternative embodiment that is not shown, the transmitter unit 40 has a handle-like formation on its top.

Furthermore, the transmitter unit 40 has a top surface and a bottom side that faces the plate 20, and a center region 80 and an annular outer region 82 spaced apart from the center region 80. A first ring magnet 84 with diametrical magnetization is located in the annular region 82. The diametrical magnetization has the effect that a north pole or a south pole is located in one circular segment of the ring magnet, and the complementary pole is located in the circular segment opposite by 180°. The first ring magnet 84 completely surrounds the center region 80 of the transmitter unit 40 and is uniformly spaced a distance from the center region 80, which is to say that the first ring magnet 84 has the shape of a thick-walled hollow cylinder. In contrast to the center region 80, the outer region 82, and consequently the first ring magnet 84, is spaced apart from the plate 20 in a vertical direction, which is to say in a direction parallel to the normal of the plate 20.

A circular base 85 is located on the bottom side of the transmitter unit 40 at the center region 80. The center region 80 accommodates a first cylindrical magnet 90 for positioning the transmitter unit 40 at a predefined rest position on the plate 20. The rest position of the transmitter unit 40 is located above the receiver unit 50, wherein the transmitter unit 40 rests with its base 85 on the plate 20. In the rest position, the axis of rotation 45 extends parallel to the normal of the plate 20, wherein the normal can also be referred to as the normal to the surface of the plate 20. In an operating position that is not shown, the axis of rotation 45 is tilted relative to the normal, which is to say that the axis of rotation 45 has an angle greater than 0° with respect to the normal of the plate 20. In this case, the base 85 rests only partially on the plate 20.

In contrast to the first ring magnet 84, the first magnet 90 has an axial magnetization, which is to say that the magnetization is implemented parallel to the direction of the axis of rotation. As a result, either a north pole or a south pole is located at the bottom side and the top side of the first magnet 90. In the present case, the bottom side of the first magnet 90 is identical to the circular base 85. The circular base 85 is beveled at least on the outside, facilitating tilting of the transmitter unit 40. A circular first flux concentrator 95 is located on the top side of the transmitter unit 40. The flux concentrator 95 is plate-shaped, wherein the diameter of the first flux concentrator 95 essentially matches the outer diameter of the first ring magnet 84. The bottom side of the first flux concentrator 95 is frictionally attached to the top side of the first ring magnet 84 and the top side of the first magnet 90. Consequently, the magnetic field lines at the top side of the transmitter unit are predominantly guided in the first flux concentrator 95, which is to say that a magnetic shielding takes place to this extent. It is advantageous for the first flux concentrator 95 to be made of mu metal.

In accordance with an embodiment that is not shown, a protective layer is formed on the bottom side of the first magnet. The protective layer is preferably beveled at the outer edges. Damage to the first magnet 90 and the surface of the plate 20 is prevented by means of the protective layer, especially when the rest position is being assumed and during a change from the rest position to the operating position. In accordance with another embodiment that is not shown, the base 85 has a diameter that is larger than the diameter of the first magnet.

The receiver unit 50 has a center region 100 and an outer region 110 spaced apart from the center region 100. The receiver unit 50 has a second cylindrical magnet 105 in the center region 100. The outer region 110 of the receiver unit 50 is annular in shape and accommodates a first type of sensors 120 and a second type of sensor 130. In the present embodiment, the first type of sensors 120 is implemented as four 1-dimensional Hall sensors. The four sensors 120 are arranged in a circle at an angle of 90° to one another. The second type of sensor 130 is implemented as a 3-dimensional Hall sensor. All sensors 120 and 130 contact the bottom side of the plate 20. Moreover, the two types of sensors are located on a printed circuit board or card 140. An integrated circuit that is not shown is also located on the card 140. The integrated circuit provides the sensors with operating power and ascertains the magnetic-field-dependent output signals from the two types of sensors 120 and 130. To reduce installed height, the card 140 has a recess in the form of a hole that is filled by the second magnet 105. On the bottom side of the magnet 105, which is to say on the side facing away from the plate 20, the magnet 105 is attached to a circular, plate-shaped second flux concentrator 150, preferably made of mu metal. Moreover, the second flux concentrator 150 has essentially the same diameter as the outer region 110. In this way, an especially high magnetic flux is achieved in the two types of sensors, and the sensitivity of the two types of sensors to a change in the magnetic flux is increased.

The method of operation is explained below. As a result of the two different poles of the first and second magnets located opposite one another, wherein the two poles are separated from one another only by the plate, a magnetic restoring force for assuming the rest position is exerted on the transmitter unit. The restoring force is not altered here with a rotation of the transmitter unit about the axis of rotation, which is to say that the transmitter unit can always be turned further with essentially the same application of force in both the rest position and the operating position, independent of the applicable amount of rotation about the axis of rotation. Preferably, the rotation of the transmitter unit takes place in the rest position.

By means of the first type of sensors, the deflection of the transmitter unit from the rest position changes the magnitude of the magnetic flux in the first type of sensors as a result of the tilting of the first ring magnet. As a result of the change in the magnetic flux, the Hall voltage changes greatly, primarily in the sensors of the first type. If the spacing between a sensor of the first type and the first ring magnet is reduced as a result of the tilting of the transmitter unit, its Hall voltage increases. In a corresponding fashion, for the Hall sensors on the opposite side, the spacing from the first ring magnet is increased and the Hall voltage decreases. The direction and amount of inclination of the transmitter unit can be determined in a simple and reliable way from the change in the Hall voltages of the sensors of the first type.

The orientation of the first ring magnet is detected by means of the second type of sensor. Because the first ring magnet has a diametrical magnetization, which is to say that in particular the circular segments located directly above the sensor of the second type cause a difference in the strength of the magnetic flux in the sensor of the second type, the angular range traversed due to the rotation can be determined with the 3-dimensional Hall sensor from the magnitude and arithmetic sign of the Hall voltage. The direction of the rotation, which is to say whether the rotation is in the clockwise or counterclockwise direction, can be determined from the behavior over time of the sensor signal or the Hall voltage.

Figure 2:
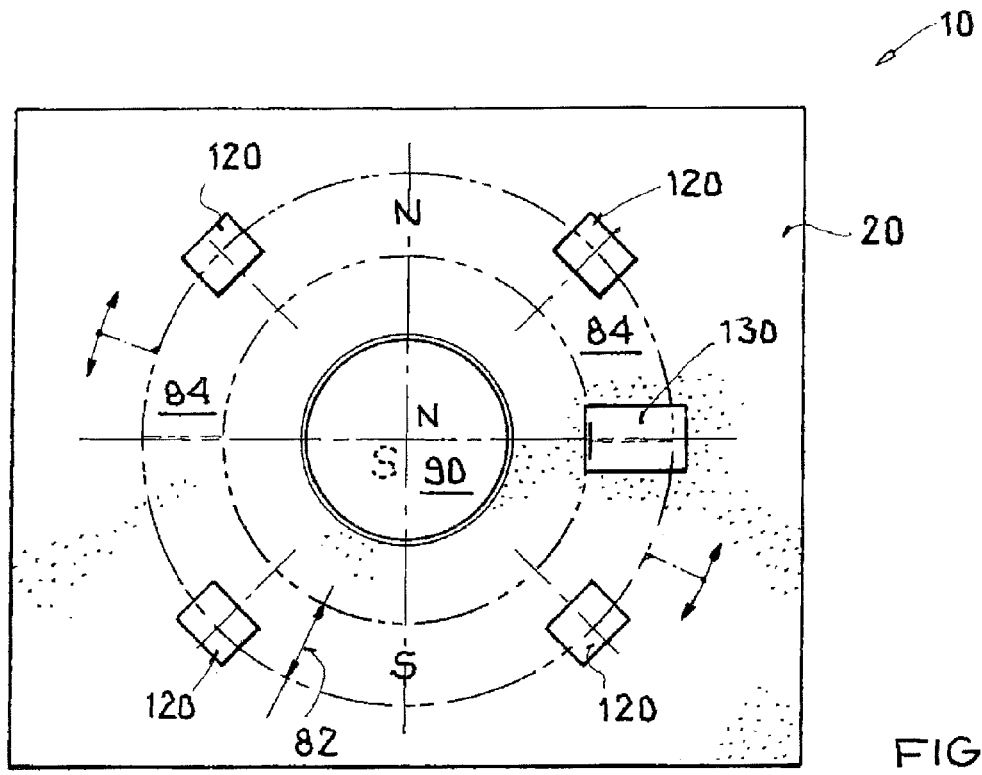
FIG. 2 shows a top view of a first embodiment of the control device from FIG. 1.

The diagram in FIG. 2 shows a top view of the embodiment [of the control device] from FIG. 1. Only the differences from the representation in FIG. 1 are explained below. For reasons of clarity, the first flux concentrator 84 and second flux concentrator 150 are not shown. The first ring magnet 84 exhibits the diametrical magnetization parallel to the plate 20. Also visible are the four Hall sensors arranged in the outer region 110 of the receiver unit 50 at an angular spacing of 90° to one another. In this case, the four sensors 120 of the first type are radially arranged partially outside the outer edge of the first ring magnet 84, at the location of maximum magnetic flux. The sensitivity of the control unit, at least with regard to detection of a tilting of the transmitter unit 40, can be increased with the precise radial alignment. For sensing of the angle of rotation, the 3-dimensional Hall sensor is located in the outer region 110 between two Hall sensors.

Figure 3A:
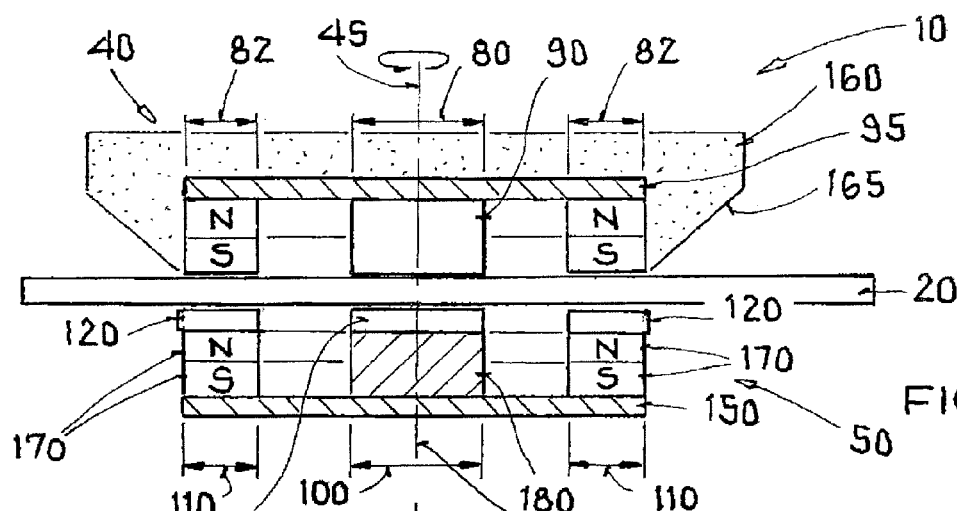
FIG. 3a shows a cross-sectional view of a second embodiment of the control device.

The diagram in FIG. 3a shows a cross-sectional view of a second embodiment of the control device. Only the differences from the representation in the preceding figures are explained below. A handle 160 is located on the top side of the transmitter unit 40. The handle 160 encompasses the top side of the first flux concentrator 95, and has a diameter larger than the outer region of the transmitter unit 40 in the lateral direction, which is to say in the direction of the extent of the plate 20. An angled surface 165 is formed on the bottom side of the handle 160. The base 85 in this design encompasses both the center region 80 and the outer region 82. The first ring magnet 84 has an axial magnetization, in the present case with a south pole on the bottom side, i.e., the side facing the plate 20. The first magnet 90 has a diametrical magnetization. The thickness of the first ring magnet 84 and the thickness of the first magnet 90 are essentially equal, and determine the spacing of the first flux concentrator 95 from the plate 20 in the axial direction. The angled surface 165 of the handle 160 determines the maximum tilt angle of the transmitter unit 40.

In the receiver unit, the sensor 130 of the second type is located in the center region 100 directly at the bottom side of the plate 20, which is to say that the axis of rotation 45 passes through the 3-dimensional Hall sensor. For reasons of clarity, the card 140 is not shown. As a result of the different construction, it is advantageous to locate the card in a separate place. A second ring magnet 170 with an axial magnetization is placed in the outer region 110 on the second flux concentrator 150. The sensors 120 of the first type are located between the second ring magnet 170 and the plate 20. The poles of the first ring magnet 84 and the second ring magnet 170 facing one another are opposite and attract one another. As a result, a restoring force is exerted on the transmitter unit 40 in the event of tilting of the transmitter unit 40. Because the first magnet 90 has a diametrical magnetization, both the rotation and, from the behavior over time, the direction of rotation, of the transmitter unit 40 can be determined by means of the 3-dimensional Hall sensor arranged below said first magnet in the vertical direction. It should be noted that in the embodiment shown an intermediate piece 180 is located between the second flux concentrator 150 and the 3-dimensional Hall sensor.

Figure 3B:
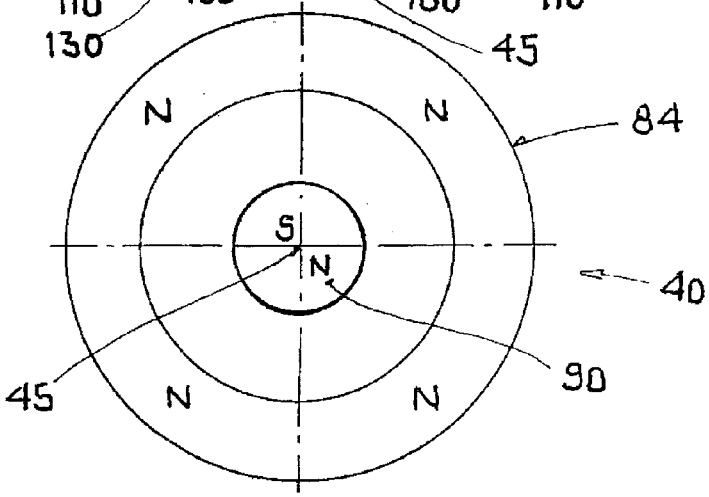
Figure 3C:
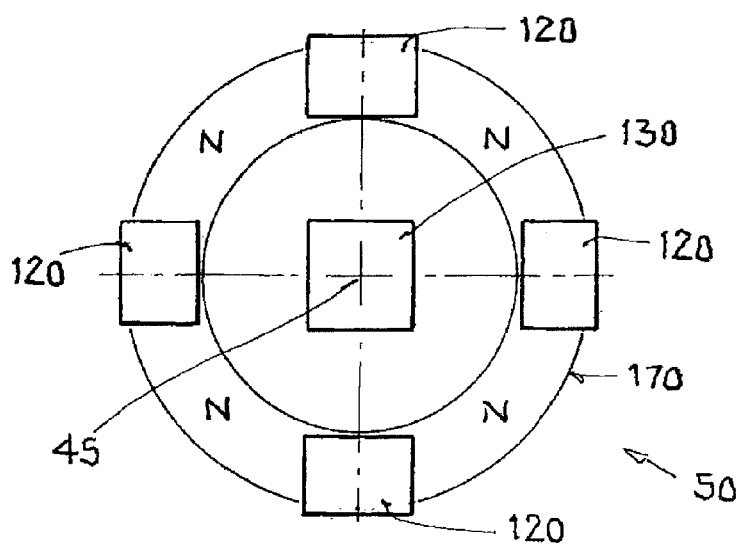

The diagrams in FIG. 3b and FIG. 3c show a top view of the transmitter unit 40 and the receiver unit 50 of the second embodiment of the control device from FIG. 3a. Only the differences from the representation in FIG. 3a are explained below. In the transmitter unit 40, the diametrical magnetization of the first magnet 90 and the axial magnetization of the first ring magnet 84 are shown. In the receiver unit 50, the sensor 130 of the second type is shown.

Figure 4:
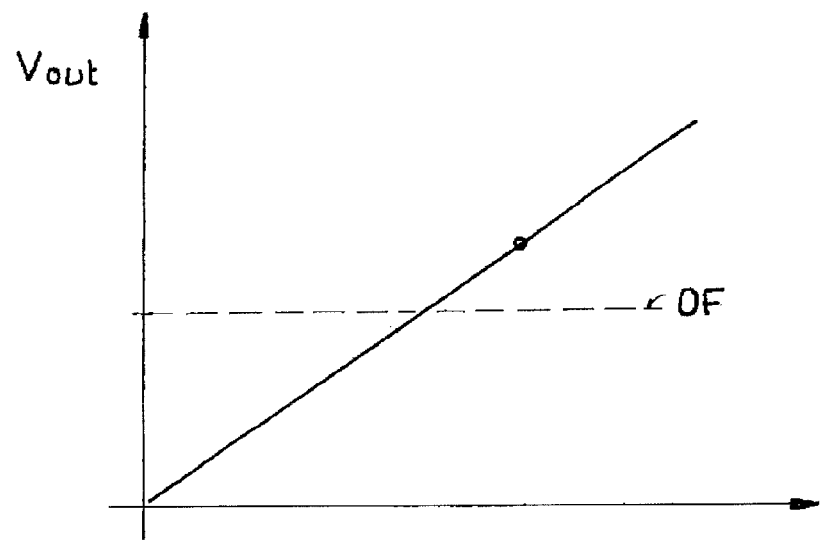
FIG. 4 shows signal behavior of the control device for performing an offset correction for a rotating transmitter unit.

The diagram in FIG. 4 shows a signal behavior of the control device for performing an offset correction for a rotating transmitter unit. Investigations have shown that a dynamic offset correction in the first type of sensors 120 can be performed advantageously to increase sensitivity. The output voltage of a sensor 120 of the first type is plotted in the direction of the ordinate. One of the sensors 120 of the first type is plotted along the abscissa. Under the assumption that all 1-dimensional Hall sensors have the same spacing from the first ring magnet during the rotation, an additional offset is added to the relevant measured value in order to reduce the tolerance error.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A control device comprising:
   a plate; and
   a control unit having a rotary unit with an axis of rotation configured as a transmitter unit and having a receiver unit, the transmitter unit being arranged above the plate and the receiver unit being arranged below the plate,
   wherein the transmitter unit has a top surface and a bottom side,
   wherein a base is formed on the bottom side in a center region and a first magnetizable element or a first magnet for positioning the transmitter unit at a predefined position over the receiver unit is arranged in the center region,
   wherein, in a rest position, the transmitter unit rests with the base on the plate and the axis of rotation extends essentially parallel to a normal of the plate or wherein the transmitter unit is tilted into an operating position such that the base rests only partially on the plate and the axis of rotation is tilted relative to the normal of the plate, and a restoring force for assuming the rest position acts on the transmitter unit by a second magnet or a second magnetizable element,
   wherein the receiver unit has a center region and has a first type of sensor in an annular outer region spaced apart from the center region,
   wherein the receiver unit has the second magnet or the second magnetizable element,
   wherein a single first ring magnet is located in an outer region of the transmitter unit, and has a continuous inner circumference surface, and
   wherein the continuous inner circumference surface of the first ring magnet surrounds the center region of the transmitter unit and is spaced apart from the center region such that through a rotation about the axis of rotation, the transmitter unit is adapted to continue to rotate with substantially a constant force.

2. The control device according to claim 1, wherein the outer region of the transmitter unit and the outer region of the receiver unit are arranged one vertically above the other in the rest position, and the two outer regions have essentially the same diameter and an essentially uniform spacing from one another.

3. The control device according to claim 1, wherein in the rest position the axis of rotation of the transmitter unit passes through the center region of the transmitter unit and through the center region of the receiver unit.

4. The control device according to claim 1, wherein a plate-shaped first flux concentrator is located on the surface of the transmitter unit facing away from the plate.

5. The control device according to claim 4, wherein the first flux concentrator covers the first ring magnet and the center region.

6. The control device according to claim 1, wherein a plate-shaped second flux concentrator is located on the surface of the receiver unit facing away from the plate.

7. The control device according to claim 6, wherein the second flux concentrator covers at least the center region and the first type of sensor.

8. The control device according to claim 1, wherein the first type of sensor senses the direction and amount of inclination of the transmitter unit relative to the normal.

9. The control device according to claim 1, wherein the first type of sensor senses a magnetic flux change parallel to the normal.

10. The control device according to claim 1, wherein the first type of sensor comprises four Hall sensors arranged at an angle of essentially 90° to one another.

11. The control device according to claim 1, wherein a second type of sensor is provided in the receiver unit at the outer region or in the center region and wherein the second type of sensor senses a rotation of the transmitter unit about the axis of rotation.

12. The control device according to claim 11, wherein the second type of sensor detects a magnetic flux change in a plane substantially perpendicular to the normal.

13. The control device according to claim 11, wherein the first and/or second types of sensors are Hall sensors.

14. The control device according to claim 1, wherein the first ring magnet has a diametrical or axial magnetization.

15. The control device according to claim 1, wherein the first magnet or the first magnetizable element and/or the second magnet or the second magnetizable element are axially magnetized parallel to the direction of the axis of rotation.

16. The control device according to claim 1, wherein the second magnet or the second magnetizable element is located in a center region of the receiver unit.

17. The control device according to claim 1, wherein the second magnet or the second magnetizable element is located in the outer region of the receiver unit as a second ring magnet and wherein the second ring magnet surrounds the center region.

18. The control device according to claim 1, wherein a printed circuit board is provided below the plate, wherein the printed circuit board is essentially uniformly spaced from the plate in a direction of extension of the printed circuit board, and wherein the printed circuit board accommodates the sensor and the second magnet or second magnetizable element on the side facing the plate.

19. The control device according to claim 18, wherein the spacing between the printed circuit board and the plate is determined by an axial extent of the second magnet or second magnetizable element.

20. The control device according to claim 18, wherein a second flux concentrator is located on a side of the printed circuit board facing away from the plate and covers the outer region of the receiver unit.

21. The control device according to claim 1, wherein the plate is a glass ceramic plate of an electric range.

22. Use of the control device according claim 1 for control of at least one cooktop of an electrical appliance.

23. Use of the control device according to claim 1 as a control knob for control of electrical devices.

* * * * *